United States Patent
Na et al.

(10) Patent No.: US 7,177,895 B2
(45) Date of Patent: Feb. 13, 2007

(54) LINEAR CHANNEL SELECT FILTER

(75) Inventors: Yoo Sam Na, Seoul (KR); Hyo Seok Kwon, Kyungki-do (KR); Ki Won Choi, Kyungki-do (KR); Seung Min Oh, Chunlabook-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 660 days.

(21) Appl. No.: 10/409,076

(22) Filed: Apr. 9, 2003

(65) Prior Publication Data

US 2004/0128340 A1 Jul. 1, 2004

(30) Foreign Application Priority Data

Dec. 27, 2002 (KR) ................ 10-2002-0085366

(51) Int. Cl.
*G06G 7/02* (2006.01)
(52) U.S. Cl. .................................... 708/819
(58) Field of Classification Search ............... 708/819
See application file for complete search history.

(56) References Cited

U.S. PATENT DOCUMENTS

| | | | | |
|---|---|---|---|---|
| 4,356,464 | A | * | 10/1982 | Fettweis .................. 333/173 |
| 4,511,992 | A | * | 4/1985 | Dureigne et al. ........... 708/819 |
| 5,612,648 | A | | 3/1997 | McClellan et al. |
| 5,931,898 | A | * | 8/1999 | Khoury .................. 708/819 |
| 5,950,112 | A | | 9/1999 | Hori et al. |
| 6,424,209 | B1 | | 7/2002 | Gorecki et al. |
| 2002/0153973 | A1 | | 10/2002 | Allott |
| 2003/0011429 | A1 | | 1/2003 | Kizaki |

FOREIGN PATENT DOCUMENTS

| | | |
|---|---|---|
| EP | 0792010 | 8/1997 |
| EP | 0957578 | 11/1999 |
| EP | 1175007 | 1/2002 |
| GB | 2280999 | 2/1995 |
| JP | 11-0330906 | 11/1999 |

OTHER PUBLICATIONS

Randall A. Geiger & Edgar Sanchez-Sinencio; Active Filter Design Using Operational Transconductance Amplifiers: A Tutorial "IEEE Circuits and Devices Magazine" vol. 1; Mar. 1985; pp. 20-32.

* cited by examiner

*Primary Examiner*—Tan V. Mai
(74) *Attorney, Agent, or Firm*—Lowe Hauptman & Berner, LLP.

(57) ABSTRACT

A linear channel select filter for an Intermediate Frequency selector of a satellite broadcasting tuner, linearly changes a desired frequency by adjusting an output current, and includes: a transconductance (GM) current cell controller for determining a control voltage according to a select signal, generating the output current according to an differential input voltage, linearly controlling the output current according to the control voltage, and providing a linearly variable resistance according to the linearly controlled output current, and a capacitor circuit coupled to the GM cell controller to provide a capacitance to generate a cutoff frequency voltage according to the output current and the variable resistance. An occupying area and a size of the filter are reduced.

18 Claims, 10 Drawing Sheets

LINEAR CHANNEL SELECT FILTER

CROSS-REFERENCE TO RELATED APPLICATION

This application claims to benefit of Korean Patent Application No. 2002-85366, filed Dec. 27, 2002, in the Korean Intellectual Property Office, the disclosure of which is incorporated herein by reference.

BACKGROUND OF THE INVENTION

1. Field of the Invention

The present invention relates to a linear channel select filter selecting an IF signal in a satellite broadcasting tuner, and more particularly, to a linear channel select filter controlling a current flowing through a filter to select a desired frequency and having a slim structure reduced in area and size.

2. Description of the Related Art

Generally, a channel select filter is used in a front end part of a receiver to select a channel. An analog filter using one of a switched capacitor filter (SCF), a MOS transistor filter, and an operational transconductor amplifier (OTA), may be used as the channel select filter. In order to use a filter characteristic of a frequency band of tens MHz, the OTA filter may be used as the analog filter. In the OTA filter, a GM-C filter using a transcondutance (GM) is widely used.

In the GM-C filter, while it is a disadvantageous in that a structure of the filter is complicate since it is difficult to control a current while its structure is used in the frequency band of tens MHz. Moreover, it is difficult to realize a method of frequency conversion by one filter as a filtering structure being dependent from a linear characteristic.

FIG. 1 is a block diagram of a conventional variable filter. As shown in FIG. 1, a plurality of filters having the same structure are connected parallel to each other to an input terminal to select one of different frequency channels by changing a filtering frequency in the conventional variable filter or the variable filter need to be redesigned.

For example, when three different frequency bands are required according to application ranges of the variable filter, such as 8 MHz, 18 MHz, and 27 MHz, the variable filter needs three switches SW1, SW2, SW3 and three different filters F1, F2, F3. However, it is a disadvantage that a layout area of the filter on a semiconductor chip increases and accordingly, a manufacturing cost of the semiconductor chip increases.

FIG. 2 is a diagram of a conventional low pass filter (LPF) 130. Referring to FIG. 2, the conventional variable LPF uses an active ladder structure which is widely known, and this active ladder filter is formed based on an RC equivalent circuit corresponding to a passive LC ladder. As shown in FIG. 2, the LPF 130 includes amplifiers A1, A2, A3, A4, and A5, resistors, and capacitors. Since resistances of the resistors are constant, a filter programming ability of the LPF is achieved by using variable capacitors, particularly, by a programmable capacitor array having capacitors C1, C2, C3, C4, C5, C213, C231, C435, and C453. A different type of LPF can be realized to have an operational parameter in a different rage.

FIG. 3 is a circuit diagram of a programmable capacitor array of the LPF shown in FIG. 2. A programmable capacitor array C1 includes twelve parallel capacitors which are user-selectable. FIG. 3 shows a couple of examples of the user-selectable capacitors 300A, 310A, 320A, and 330A which are connected to respective user selectable switches 300B, 310B, 326B, and 330B. A user can select a capacitance of the user selectable capacitors using the respective selectable switches. As shown in FIGS. 2 and 3, a filtered frequency can vary according to the selected capacitance of the user selectable capacitors in the conventional LPF 130.

However, it is impossible to accurately select a desired capacitance using the user selectable capacitors of the programmable capacitor array taking into consideration that the number of the user selectable capacitors cannot be increased indefinitely, and that the number of the user selectable capacitors is limited. Moreover, since a selection of the capacitance is performed non-linearly, it is difficult to accurately select a precise capacitance. Due to these problems, there is a limitation to select the desired of the conventional variable filter.

Since the conventional variable LPF can not be used as a filter requiring a linear frequency selecting performance, a linear filter having an excellent linear characteristic is needed to satisfy a required size and desirable manufacturing cost.

SUMMARY OF THE INVENTION

In order to solve the above and/or other problems, it is an aspect to provide a linear channel select filter linearly changing a desired frequency by controlling an internal current flowing through the filter.

It is another aspect of the invention to provide a linear channel select filter linearly selecting a desired frequency as well as reducing an area and a size of the filter.

Additional aspects and advantages of the invention will be set forth in part in the description which follows and, in part, will be obvious from the description, or may be learned by practice of the invention.

To achieve the above and/or other aspects, a linear channel select filter selecting a desired frequency using a resistor and a capacitor includes a GM current cell controller determining a control voltage according to a selection signal, providing an output current according to a differential input voltage, linearly controlling the output current according to the control voltage, and generating a linearly variable resistance to the linearly controlled output current, and a capacitor circuit coupled to the GM current cell controller to generate the capacitance to generate a cutoff frequency voltage in accordance with the variable resistance.

BRIEF DESCRIPTION OF THE DRAWINGS

These and other advantages of the invention will become apparent and more readily appreciated from the following description of the preferred embodiment, taken in conjunction with the accompanying drawings of which.

DETAILED DESCRIPTION OF THE PREFERRED EMBODIMENTS

Figure 1:
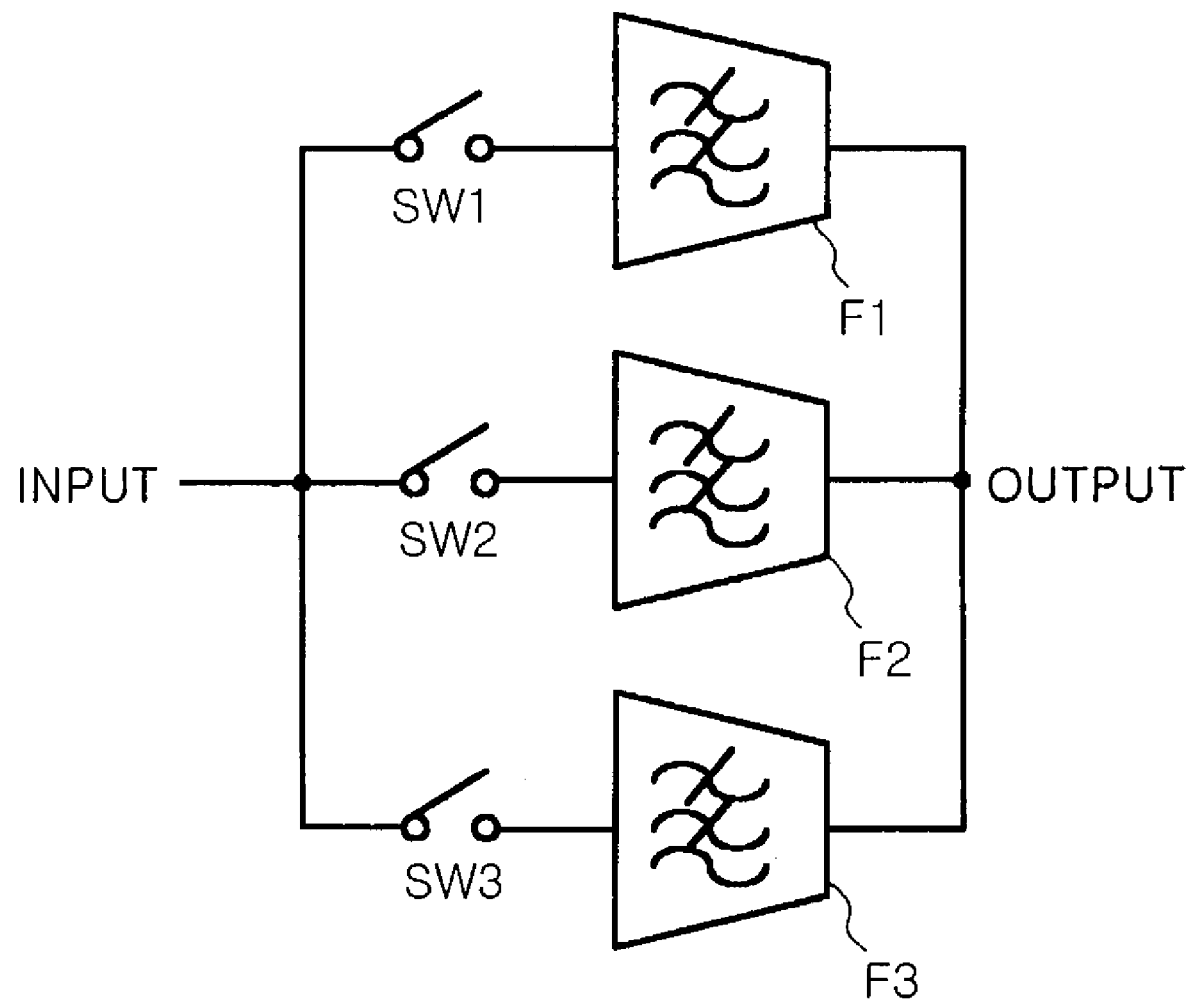
FIG. 1 is a block diagram of a conventional variable filter.
Figure 2:
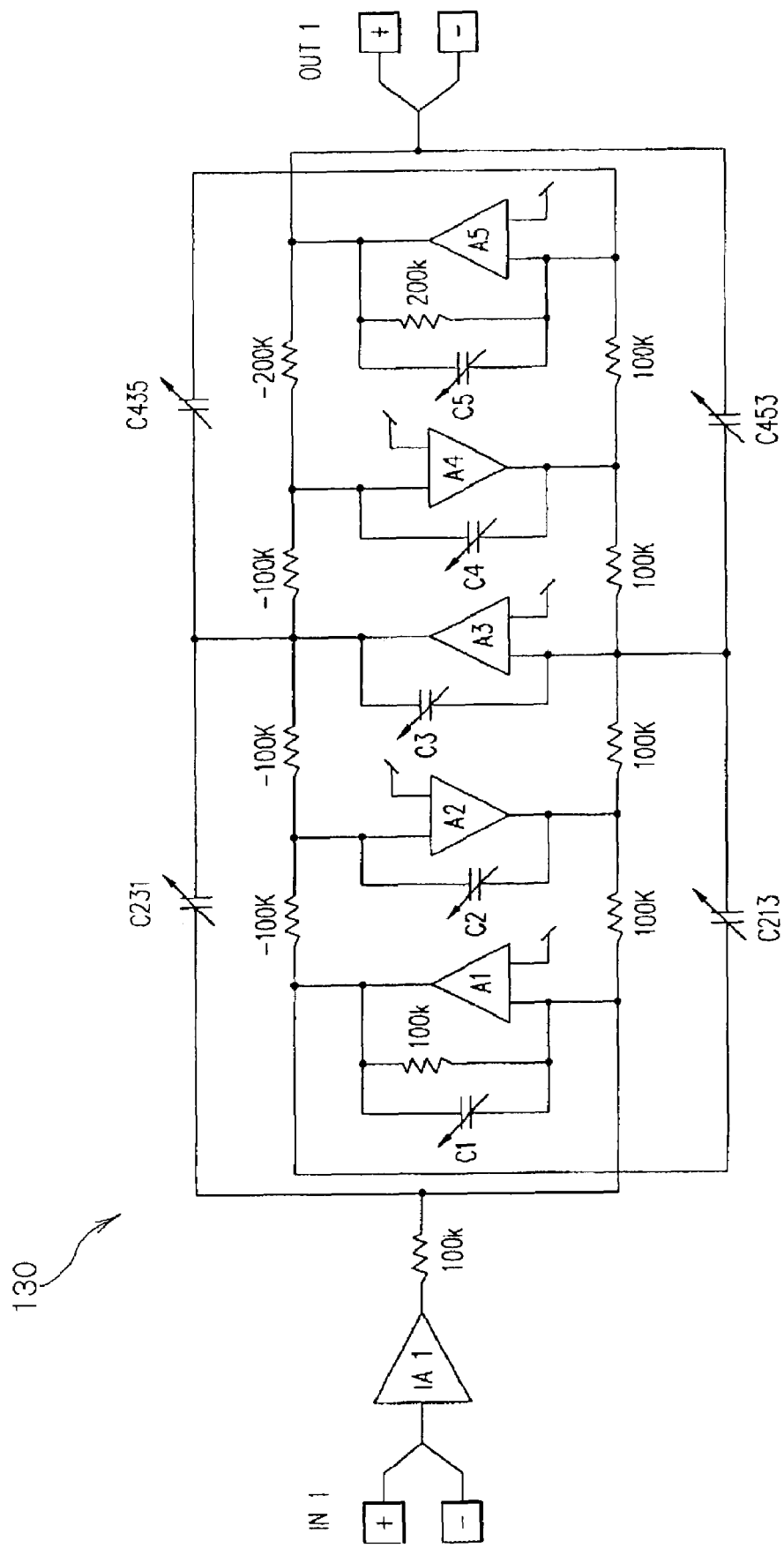
FIG. 2 is a diagram of a conventional low pass filter (LPF)
Figure 3:
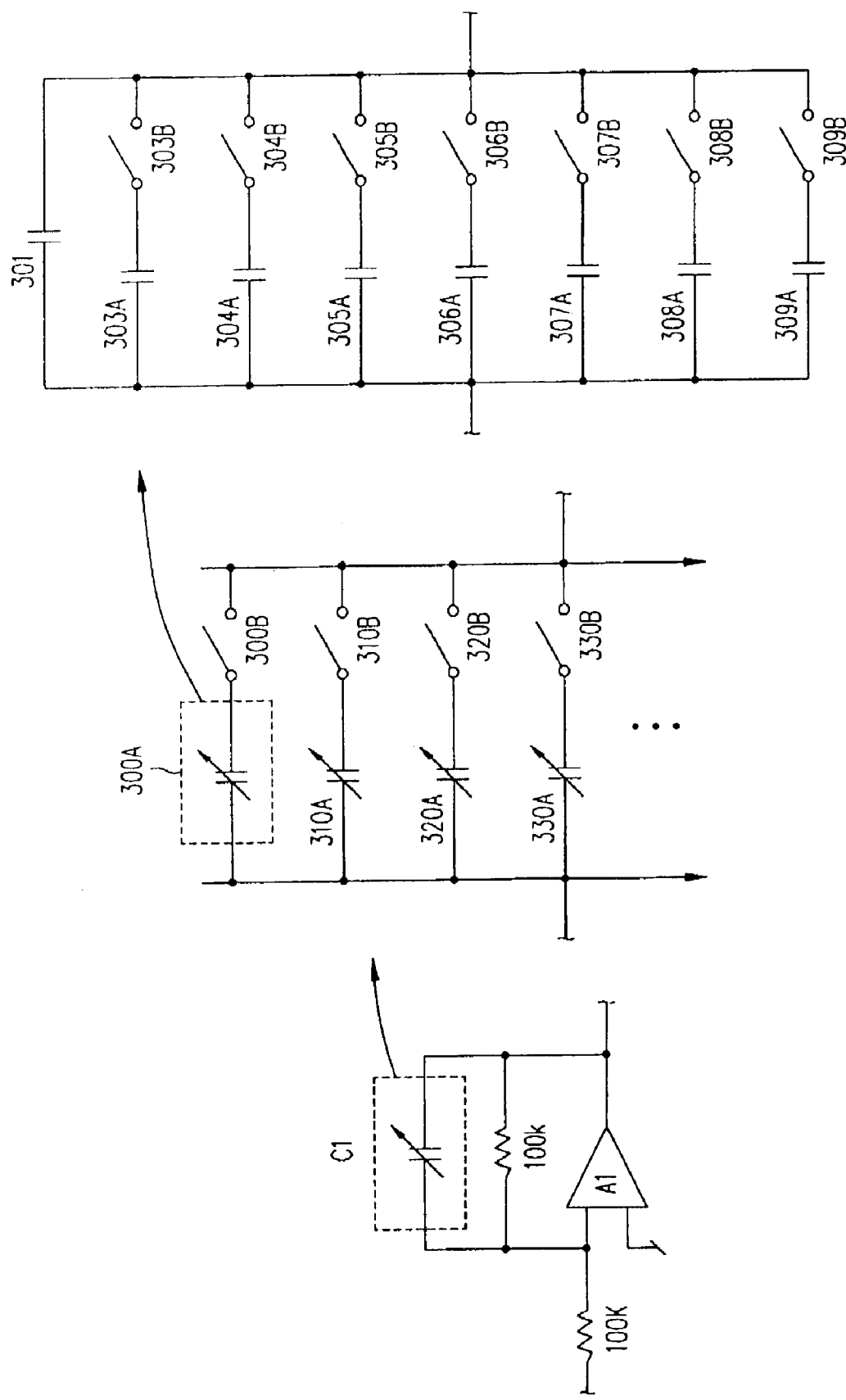
FIG. 3 is a circuit diagram of a programmable capacitor array of the LPF shown in FIG. 2.

Reference will now be made in detail to the present preferred embodiment of the present invention, examples of which are illustrated in the accompanying drawings, wherein like reference numerals refer to the like elements throughout. The embodiment is described below in order to explain the present invention by reference to the figures.

Figure 4:
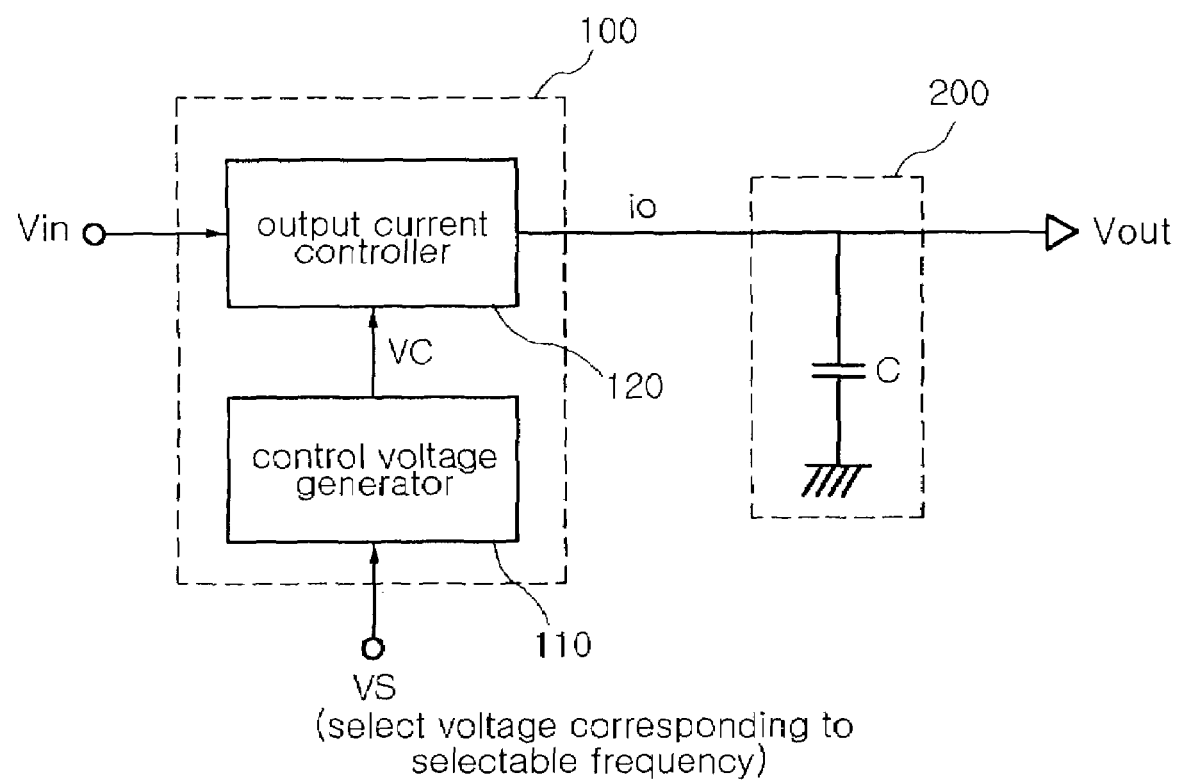
FIG. 4 is a block diagram of a linear channel select filter according to an embodiment of the present invention.

FIG. 4 is a block diagram of a linear channel select filter according to an embodiment of the present invention. As shown in FIG. 4, the liner channel select filter selects a predetermined frequency using a resistance R and a capacitance C and includes a GM current cell unit (GM current controller) 100 determining a control voltage VC according to a select signal VS, generating an output current io according to an differential input voltage Vin, linearly controlling the output current io according to the control voltage VC, and generate a linearly variable resistance RGM according to the linearly controlled output current io, and a capacitor circuit 200 coupled to the GM cell unit 100 to generate the capacitance C to generate a cutoff frequency voltage in accordance with the variable resistance RGM.

The GM current cell unit 100 includes a control voltage generator 110 generating the control voltage VC determined according to the select signal VS and the output current controller 120 generating the output current io according to the differential input voltage Vin, linearly controlling the output current io according to the control voltage VC, and generating the linearly variable resistance RGM according to the linearly controlled output current io. The select signal VS includes a plurality of switching signals VS1–VS4 corresponding to respective desired select frequencies according to the select signal VS.

Figure 5:
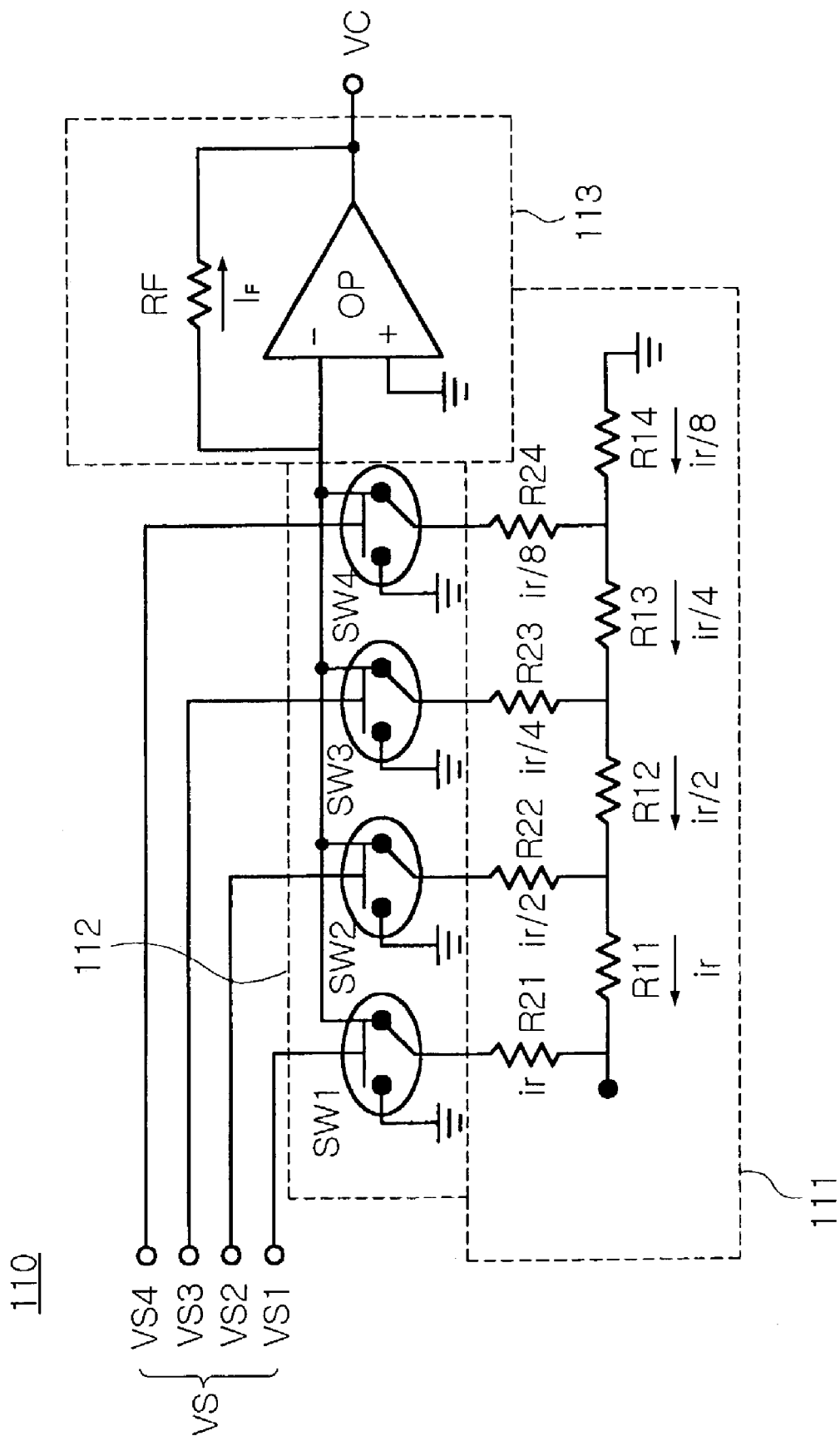
FIG. 5 is a diagram of a control voltage controller of the linear channel select filter shown in FIG. 4.

FIG. 5 is a diagram of a control voltage generator 110 of the linear channel select filter shown in FIG. 4. Referring to FIG. 5, the control voltage generator 110 may include a D/A converter and also includes a resistance circuit 111 having a plurality of resistors between a reference potential Vref and ground, a switch unit 112 having a plurality of switches SW1, SW2, SW3, SW4 to select corresponding ones of the resistors of the resistance circuit 111, a voltage generating unit 113 generating the control voltage VC according to a resistance value determined according to the selected resistor of the resistance circuit 111.

In a circuit of the control voltage generator 110, the resistance circuit 111 includes a first resistor unit having a plurality of first resistors R11–R14 coupled in series between the reference potential –Vref and the ground, and a second resistor unit having a plurality of second resistors R21–R24 coupled between the adjacent first resistors R11–R14.

The switch unit 112 includes a plurality of switches SW1–SW4 switching between the ground and corresponding ones of the second resistors of the second resistor unit, and the switches SW1–SW4 are controlled by corresponding ones of the switching signals VS1–VS4.

The voltage generating unit 113 includes an operational amplifier (OP) having a positive terminal coupled to the second resistors of the second resistor unit, a negative terminal coupled to the ground, and an output terminal coupled to the negative terminal through a feedback resistor RF to generate the control voltage VC according to a ratio of a value of a resistance RSW of the resistance circuit 111 and another value of a resistance of the feedback resistor RF.

Figure 6:
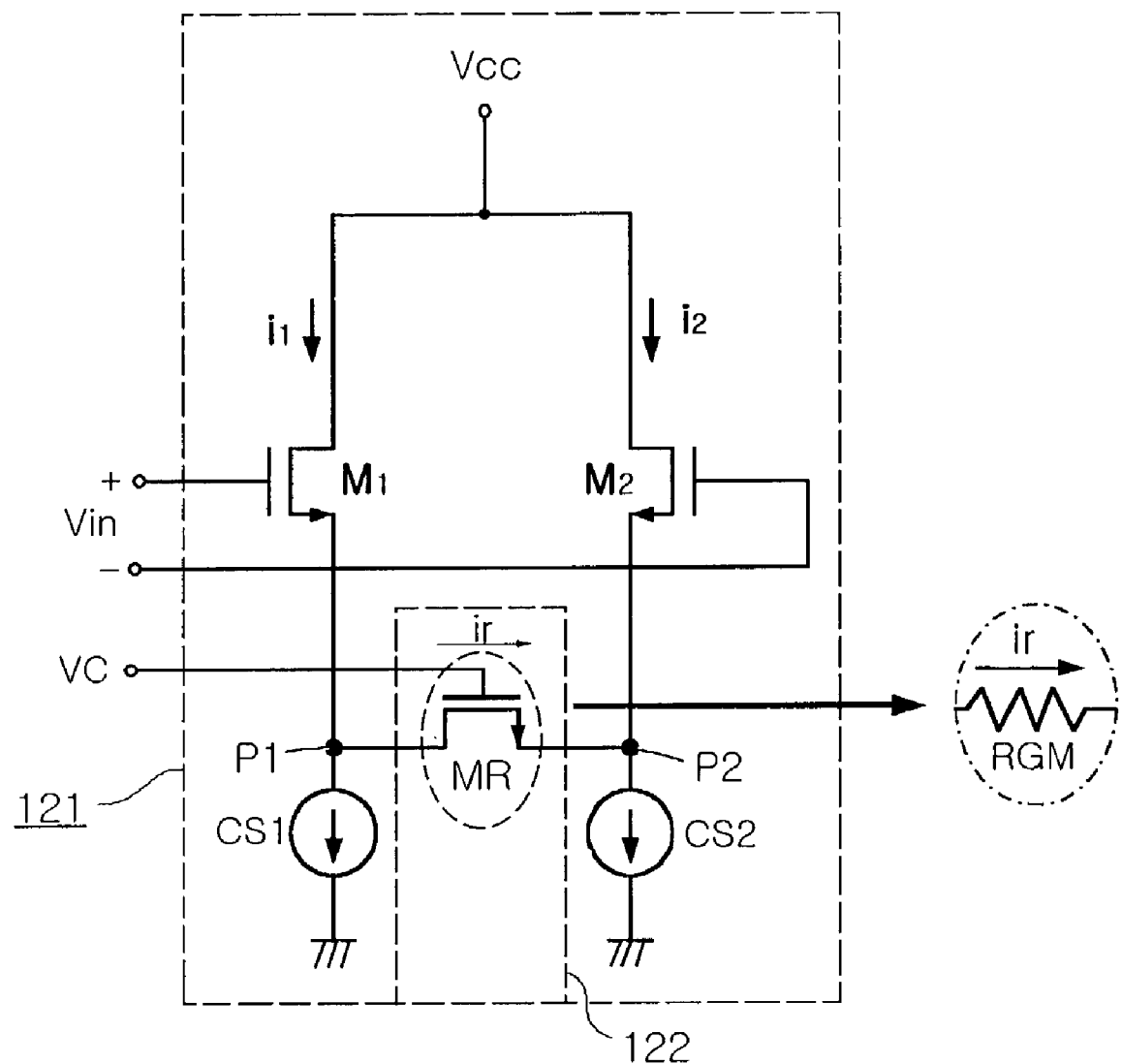
FIG. 6 is a circuit diagram of an output current controller of the linear channel select filter shown in FIG. 4.

FIG. 6 is a circuit diagram of the output current controller 120 of the linear channel select filter shown in FIG. 4. Referring to FIG. 6, the output current controller 120 includes a current generating unit 121 generating the output current io according to the differential input voltage Vin and a current control unit 122 linearly controlling the output current io according to the control voltage VC generated from the control voltage generating unit 110.

In a circuit of the output current controller 120, the current generating unit 121 of the output current controller 120 includes a first MOS transistor M1 having a first gate terminal coupled to a positive input terminal of the differential input signal Vin and a first drain terminal coupled a voltage source Vcc, a first current source CS1 coupled between the ground and a first source terminal of the first MOS transistor M1, a second MOS transistor having a second drain terminal coupled to the voltage source Vcc and a second gate coupled between the ground and a negative terminal of the second MOS transistor, and a second current source coupled between the ground and a second source terminal of the second MOS transistor M2.

The current control unit 122 includes a third MOS transistor MR having a third drain terminal coupled to the first source terminal P1 of the first MOS transistor M1, a third source terminal coupled to the second source terminal P2 of the second MOS transistor M2, and a third gate terminal coupled to the control voltage VC to control the output current io flowing between the third drain terminal and the third source terminal according the control voltage VC.

An operation of the linear channel select filter having the above structure will be explained hereinafter in conjunction with FIGS. 4 through 6. The linear channel select filter has a function of linearly selecting a predetermined frequency using the resistance R and the capacitance C.

In the operation of the linear channel select filter as shown in FIG. 4, the GM current cell unit (GM current controller) 100 determines the control voltage VC according to the select signal VS, generates the output current io according to the differential input voltage Vin, linearly controls the output current io according to the control voltage VC, and generates the linearly variable resistance RGM according to the linearly controlled output current io. The capacitor circuit 200 is coupled to the GM cell unit to generate the capacitance C. A cutoff frequency Fcut of the linear channel select filter is expressed by the following formula.

Formula 1

Fcut=$1/(2\pi$ RGM*C), wherein Fcut is the cutoff frequency, RGM is the resistance determined by the GM current cell unit 100, and C is the capacitance determined by the capacitor circuit 200.

In the operation of the GM current cell unit 100, the GM current cell unit (GM current controller) 100 generates the control voltage VC according to the select signal VS, and the output current control unit 120 of the GM current cell unit 100 provides the output current io according to the differential input voltage Vin, linearly controls the output current io according to the control voltage VC, and generates the linearly variable resistance RGM according to the linearly controlled output current io.

The output current controller 120 linearly changes the resistance according to the control voltage VC, and the cutoff frequency can be linearly changed according to the linear channel select filter to accurately select the precise desired frequency F.

The output current controller 120 of the GM current cell unit 100 provides the output current io according to the differential input voltage Vin. The select signal VS includes the switching signals VS1–VS4 corresponding to desired frequencies F. The switching signals VS1–VS4 may have one of a high signal and a low signal.

In an operation of the control voltage generator 110 as shown in FIGS. 4 and 5, the control voltage generator 110 includes the resistance circuit 111, the switch unit 112, and the voltage generating unit 113. The switches SW1–SW4 of the switch unit 112 are turned on and off according to the switching signals VS1–VS4.

One or more resistors of the resistance circuit 112 are selected according to on and off states of the switches SW1–SW4 to determine the resistance RSW of the resistance circuit 111. The control voltage generator 113 generates the control voltage VC according to the resistance RSW of the resistors of the resistance circuit 111 selected by the switch unit 112.

In the operation of the control voltage generator 110, the on and off states of the switches SW1–SW4 of the switch unit 112 according to the switching signals VS1–VS4 are shown in the following table.

TABLE

| SELECT SIGNAL(VS) | | | | SWITCH | | | |
|---|---|---|---|---|---|---|---|
| VS1 | VS2 | VS3 | VS4 | SW1 | SW2 | SW3 | SW4 |
| L | L | L | H | OFF | OFF | OFF | ON |
| L | L | H | L | OFF | OFF | ON | OFF |
| L | H | L | L | OFF | ON | OFF | OFF |
| H | L | L | L | ON | OFF | OFF | OFF |
| H | H | H | H | ON | ON | ON | ON |

According to an switching operation of the switch unit 112, one or more resistors of the resistance circuit 111 are selected to determine the resistance RSW. Here, the operational amplifier OP of the control voltage generating unit 113 amplifies an differential input voltage Vin according to a ratio of the resistance RSW and the feedback resistance RF to provide an output voltage Vout which is the control voltage VC, to the output current controller 120. The control voltage Vout of the controlvoltage generator 110 can be expressed by the following formula.

$$Vout = RF \sum_{i=0}^{4} \frac{VSi \cdot ir}{2^{i-1}} \qquad \text{Formula 2}$$

$$= Vref \frac{RF}{RSW} \sum_{i=0}^{4} \frac{VSi}{2^i}$$

Here, Vout is an output voltage of the operational amplifier OP, Vref is the reference voltage, RF is the feedback voltage of the feedback resistor, VS is the select voltage, ir is a current flowing through the resistor of the resistance circuit 111 having the resistance RSW, and RSW is the resistance determined by the resistance circuit 111.

In an operation of the output current controller 120 shown in FIGS. 4 through 6, the output current controller 120 includes the current generating unit 121 and the current control unit 122, the current generating unit 121 generates the output current io according to the differential input voltage Vin, and the current control unit 122 linearly control the output current io provided from the current generating unit 121 according to the control voltage VC generated from the control voltage generator 110.

Figure 8:
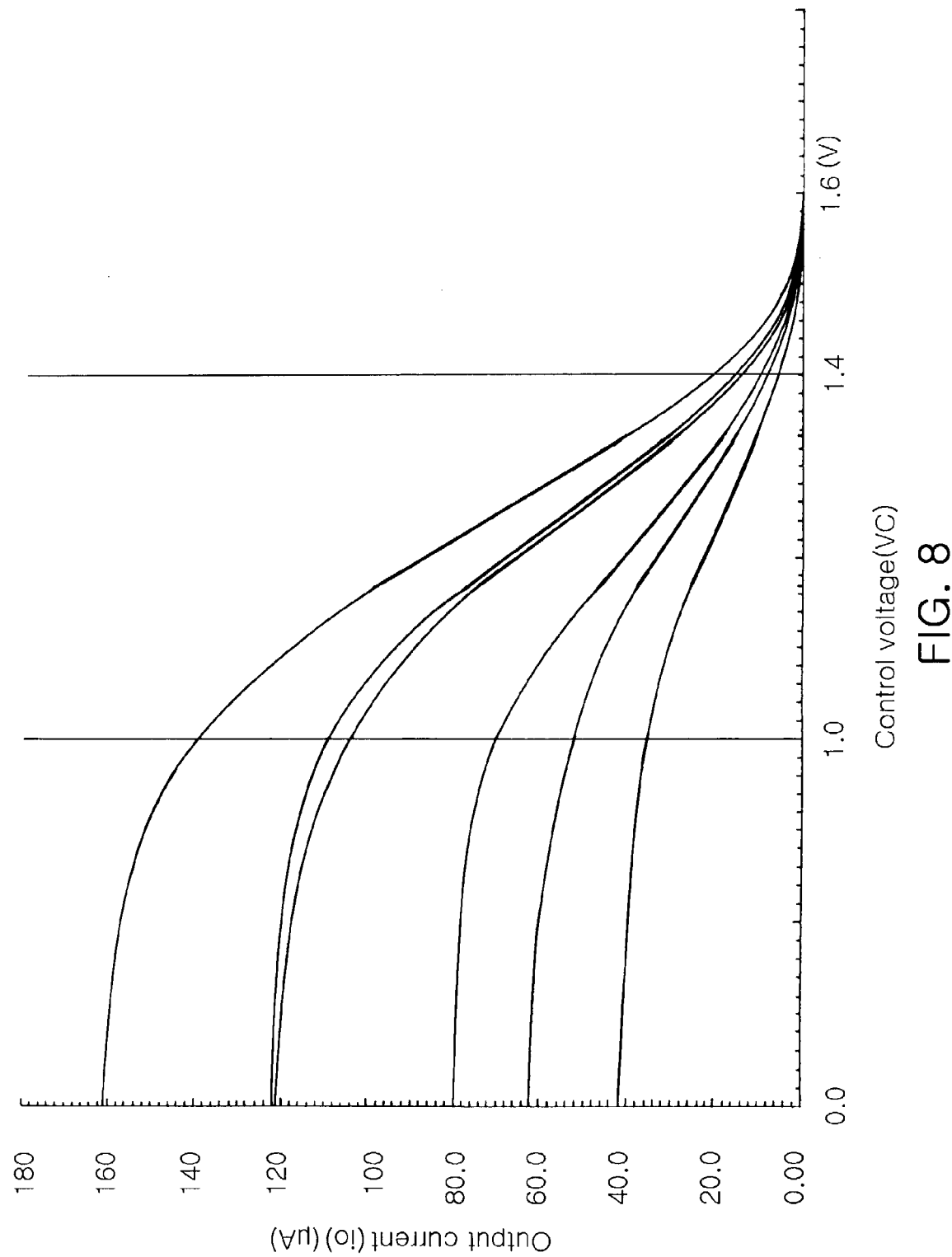
FIG. 8 is a view showing a linear transition curve of a control voltage-output current in the linear channel select filter shown in FIG. 4.

In an operation of the current generating unit 121 of the output current controller 120, the first and second current sources CS1, CS2 generates first and second currents i1, i2 flowing through respective ones of the first and second MOS transistors M1, M2 according to the differential input voltage Vin, and a third current ir flowing through the third MOS transistor MR of the current control unit 122 is linearly controlled according to the control voltage VC of the control voltage generator 110. the third current ir is proportional to the output current io, and the third current proportional to the output current io varies even when an input voltage is constant. thus, the output current io can be linearly controlled as shown in FIG. 8.

FIG. 8 shows the output current io which is linearly variable according to the control voltage in a range between 1.0V and 1.4V.

This linear variation of the output current represents that the equivalent resistance RGM of the current control unit 122 linearly varies. If a linear MOSFET is used as the third MOS transistor MR, the output current io can be expressed by the following formula 3.

$$io = i1 - i2 = 2ir = \frac{2}{RGM} \cdot \Delta Vin = GM \cdot \Delta Vin \qquad \text{Formula 3}$$

Here, io is the output current, i1, i2 are the first and second currents flowing through the first and second MOS transistors M1, M2, respectivley, RGM is the equivalent resistance of the third MOS transistor MR, Vin is the input voltage of the third MOS transistor MR, and GM is the transconductoance.

The output current io of FIG. 6 is the current flowing through a circuit coupled between the terminals P1, P2, and the output current io is proportional to the third current ir.

As described above, the output current io linearly varies according to the control voltage VC determined by the select signal VS in the GM current cell unit 100, and the internal equivalent resistance RGM linearly varies according to the linearly variable output current io. Accordingly, the cutoff frequency Fcut can be linearly variable according to the linear channel select filter.

Figure 7:
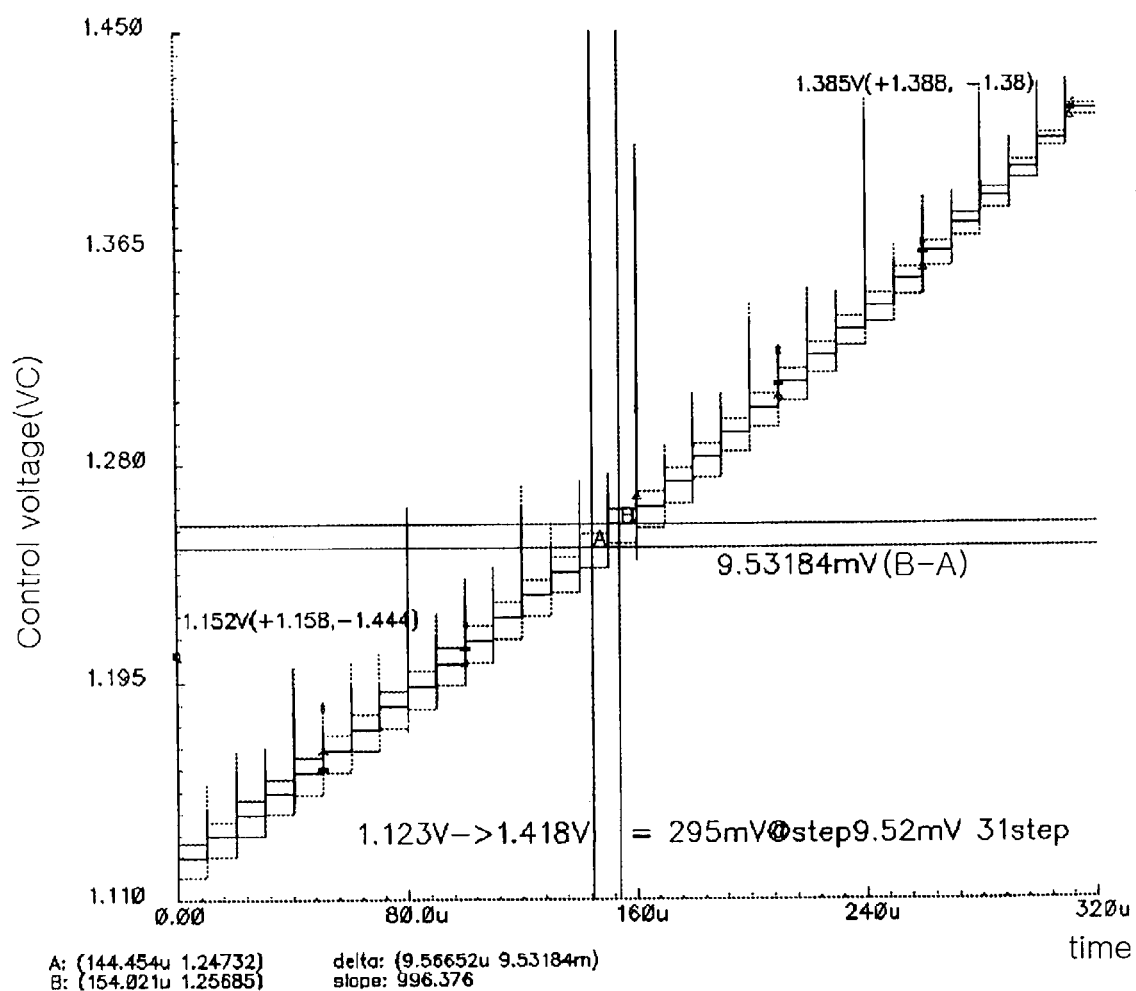
FIG. 7 is a view showing a simulation graph of a control voltage in the linear channel select filter shown in FIG. 4.

The control voltage VC of the linear channel select filter is a very small voltage, such as a predetermined voltage having the range between 1.0V and 1.4V. A selection of the desired frequency should be done by linearly changing this small range of the voltage. Thus, the control voltage generator 110 uses the D/A converter to convert an input digital signal to an analog signal which is used as the current control voltage for the desired frequency selection. FIG. 7 shows a simulation graph with respect to the analog signal of the D/A converter in the linear channel select filter shown in FIG. 4.

In FIG. 7, the control voltage VC in the range between 1.23 V and 1.418 V is generated for the desired frequency and is controllable in 31 steps.

Figure 9A:
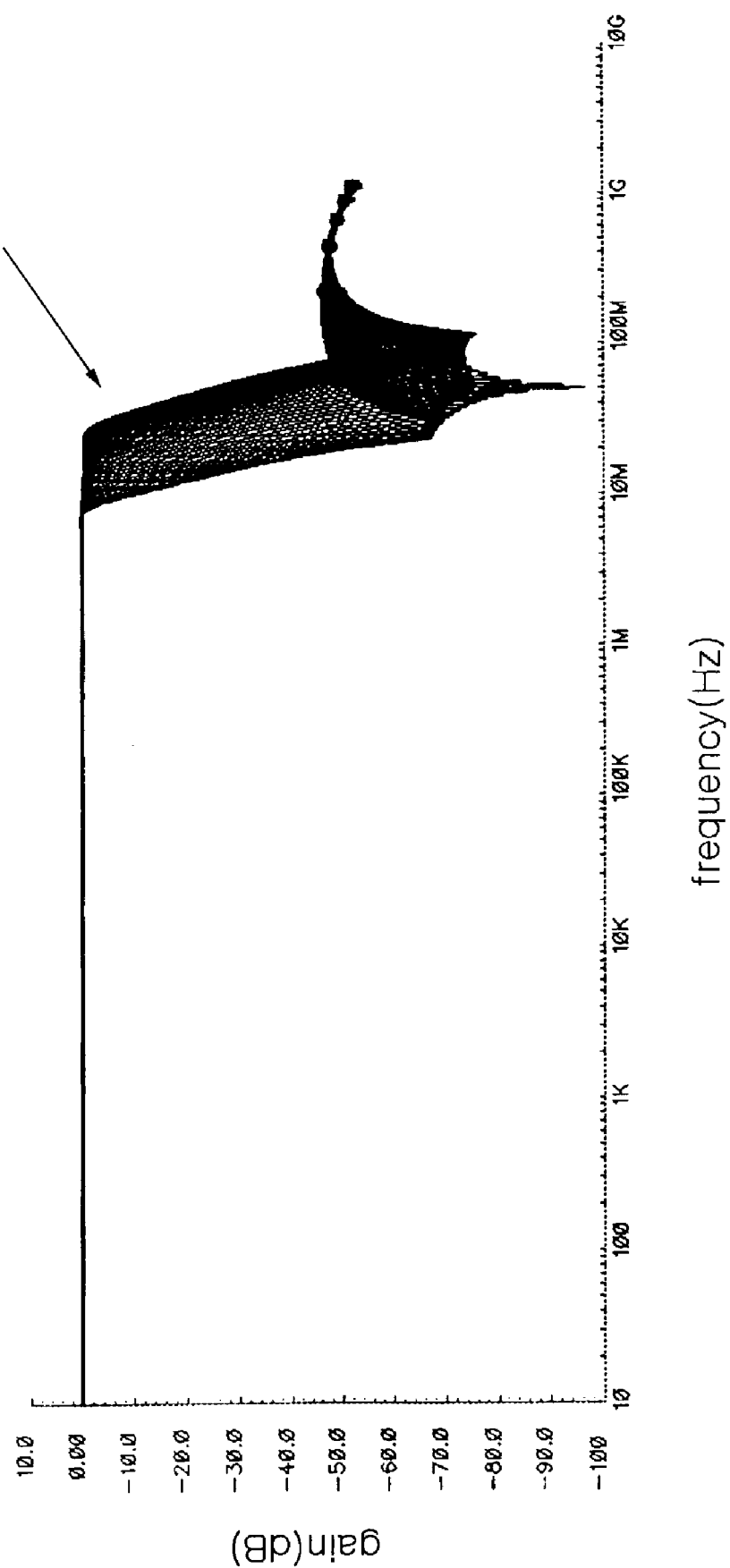
FIGS. 9A and 9B are views showing tuning graphs in the linear channel select filter shown in FIG. 4.
Figure 9B:
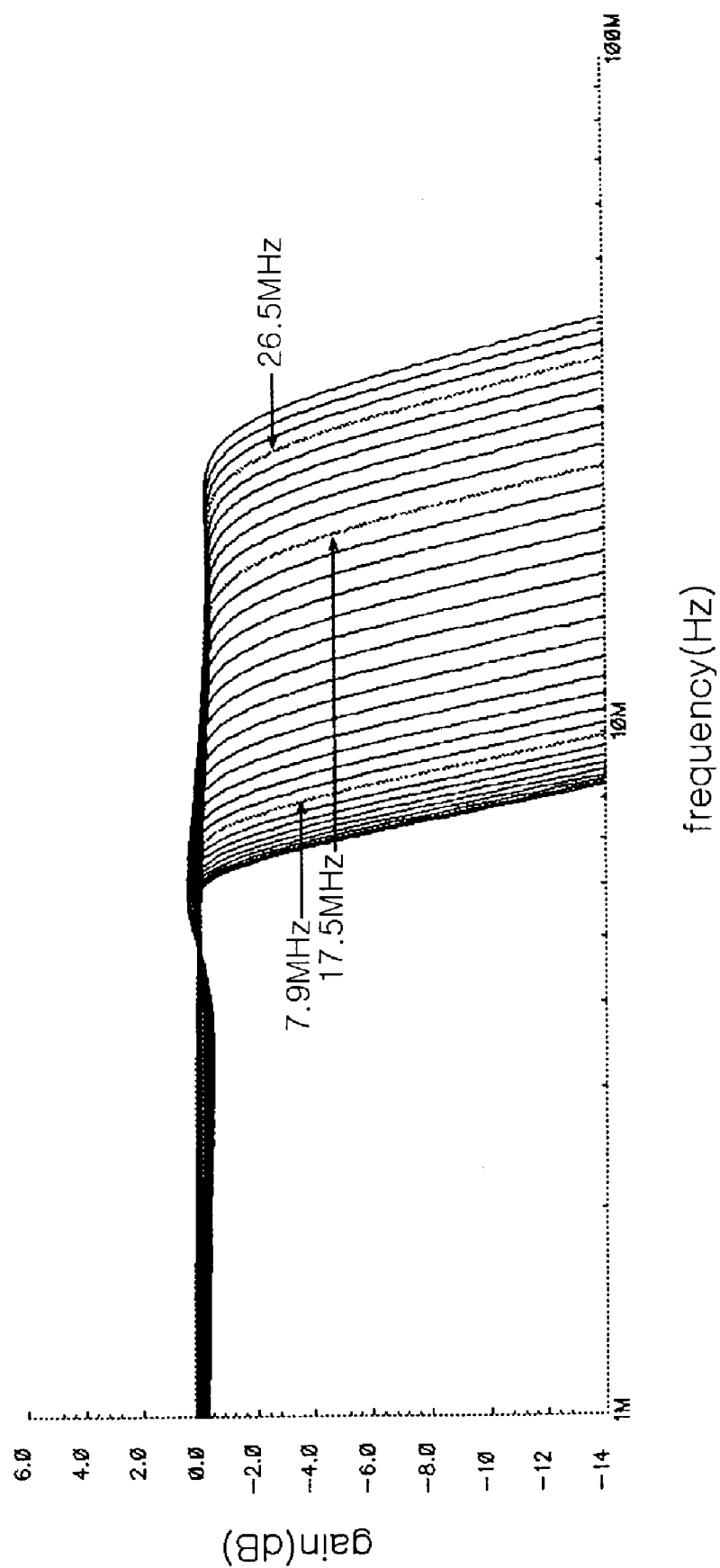

When a low pass filter is used as the linear channel select filter, the desired frequency can be selected as shown in FIGS. 9A and 9B, and a portion indicated by an arrow is enlarged to a view of FIG. B. When the desired frequency is 7.9 MHz, 17.5 MHz, and 26.5 MHz, all these frequencies can be selected as shown in FIG. 9B.

As described above, the filter using the linear channel select filter may include the LPF, a HPF, and a BPF, and the linear channel select filter can be used in an IF selector of a satellite broadcasting tuner, an RF filter, and a channel selecting apparatus. The linear channel select filter can be used in a receiver having a zero IF structure (circuit) in which an input frequency is the same as a local oscillator. since a center frequency of a mixer output of the zero IF circuit is 0 MHz, it is possible to select a frequency band selectively controlling data other than the desired carrier signal.

As described above, the linear channel select filter can be formed in a simple structure which can be used for the IF selector of the satellite broadcasting tuner, and linearly changes the desired frequency by adjusting the output current of the linear channel select filter, thereby linearly selecting the desired frequency and reducing an occupying area and a size of the filter.

The linear channel select filter can be operated in tens MHz using a 0.18 mm CMOS process according to the present invention.

Although an embodiment of the present invention has been shown and described, it would be appreciated by those skilled in the art that changes may be made in this embodiment without departing from the principle and sprit of the invention, the scope of which is defined in the claims and their equivalent.

What is claimed is:

1. A linear channel select filter for selecting a desired frequency using a resistance and capacitance, comprising:
    a GM current cell controller for determining a control voltage according to a selection signal, providing an output current according to a differential input voltage, linearly controlling the output current according to the control voltage, and providing a linearly variable resistance according to the linearly controlled output current; and
    a capacitor circuit coupled to the GM current cell controller to provide a capacitance to generate a cutoff frequency voltage in accordance with the variable resistance.

2. The linear channel select filter of claim 1, wherein the GM current cell controller comprises:
    a control voltage generator for generating the control voltage determined according to the selection signal; and
    an output current controller for generating the output current according to the differential input voltage, linearly controlling the output current according to the control voltage, and providing the linearly variable resistance according to the linearly controlled output current.

3. The linear channel select filter of claim 2, wherein the control voltage generator comprises:
    a resistance circuit having a plurality of resistors between a reference potential and ground;
    a switch unit having a plurality of switches to select corresponding ones of the resistors of the resistance circuit; and
    a voltage generating unit for generating the control voltage according to a resistance value determined according to the selected resistor of the resistance circuit.

4. The linear channel select filter of claim 2, wherein the output current controller comprises:
    a current generating unit for generating the output current according to the differential input voltage; and
    a current control unit linearly for controlling the output current according to the control voltage generated from the control voltage generator.

5. The linear channel select filter of claim 2, wherein the control voltage generator comprises:
    a resistance circuit having a first resistor unit having a plurality of first resistors coupled in series between a reference potential and ground and a second resistor unit having a plurality of second resistors coupled between the corresponding adjacent first resistors;
    a switch unit having a plurality of switches to select corresponding ones of the second resistors of the resistance circuit; and
    a voltage generating unit having an operational amplifier which has a positive terminal coupled to the second resistors of the second resistor unit, a negative terminal coupled to ground, and an output terminal coupled to the negative terminal through a feedback resistor to generate the control voltage according to a ratio of a resistance value determined according to the selected second resistor of the resistance circuit and a resistance value of the feedback resistor.

6. The linear channel select filter of claim 2, wherein the output current controller comprises:
    a first MOS transistor having a first gate terminal coupled to receive a positive input component of the differential input signal and a first drain terminal coupled to a voltage source;
    a first current source coupled between ground and a first source terminal of the first MOS transistor;
    a second MOS transistor having a second drain terminal coupled to the voltage source and a second gate terminal coupled to receive a negative input component of the differential input signal; and
    a second current source coupled between ground and a second source terminal of the second MOS transistor.

7. A linear channel select filter for selecting a desired frequency using a resistance and a capacitance, comprising:
    a GM current cell controller having a first input terminal for receiving a selection signal, a second input terminal for receiving an input voltage, a control voltage generator for generating a control voltage according to the selection signal, an output current controller for generating first and second currents according to the input voltage and providing a linearly variable resistance in response to the first and second currents to linearly generate an output current, and an output terminal for outputting the linearly generated output current; and
    a capacitor circuit coupled to the output terminal of the GM current cell controller to provide a capacitance to generate a voltage signal corresponding to the desired frequency according to the linearly generated output current.

8. The linear channel select filter of claim 7, wherein the output current controller comprises:
    a current generating unit for generating the first and second currents according to the input voltage; and
    a current control unit for providing the linearly variable resistance in response to the first and second currents to linearly generate the output current.

9. The linear channel select filter of claim 8, wherein the output current controller further comprises a voltage source and first and second current sources, and the current generating unit comprises:

a first transistor coupled to receive the input voltage and coupled to the voltage source and the first current source to generate the first current; and a second transistor coupled to receive the input voltage and coupled to the voltage source and the second current to generate the second current.

10. The linear channel select filter of claim 9, wherein the input voltage comprises positive and negative components, and the first transistor comprises:

a first gate terminal coupled to receive the positive component of the input voltage;

a first drain terminal coupled the voltage source; and a first source terminal coupled to the first current source to generate the first current.

11. The linear channel select filter of claim 10, wherein the second transistor comprises:

a second gate terminal coupled to receive the negative component of the input voltage;

a second drain terminal coupled to the voltage source; and a second source terminal coupled to the second current source to generate the second current.

12. The linear channel select filter of claim 9, wherein the current control unit is coupled between the first and second transistors.

13. The linear channel select filter of claim 9, wherein the current control unit comprises:

a third transistor having a drain terminal coupled to the first transistor, a source terminal coupled to the second transistor, and a gate terminal coupled to the control voltage generator to receive the control voltage.

14. The linear channel select filter of claim 7, wherein the selection signal is a digital signal, and the control voltage generator comprises:

a D/A converter for converting the digital signal to an analog signal corresponding to the control voltage.

15. The linear channel select filter of claim 14 wherein the control voltage generator comprises:

a differential amplifier for generating the control voltage in response to the analog signal.

16. The linear channel select filter of claim 15, wherein the differential amplifier comprises:

an inverting input terminal for receiving the analog signal;

a non-inverting input terminal for receiving a reference potential; and an voltage output terminal for outputting the control voltage according to the analog signal and the reference-potential.

17. The linear channel select filter of claim 16, wherein the differential amplifier comprises:

a feedback resistor coupled between the voltage output terminal and the inverting input terminal.

18. The linear channel select filter of claim 17, wherein the output current is proportional to a difference between the first and second currents.

* * * * *